United States Patent
Takagi et al.

(10) Patent No.: US 8,097,541 B2
(45) Date of Patent: Jan. 17, 2012

(54) METHOD FOR SURFACE TREATING SEMICONDUCTOR

(75) Inventors: Mikio Takagi, Kanagawa (JP); Seiichi Takahashi, Shizuoka (JP); Hiroaki Inoue, Shizuoka (JP); Masayuki Satou, Shizuoka (JP); Yutaka Miura, Shizuoka (JP)

(73) Assignees: F.T.L. Co., Ltd., Kawasaki-shi (JP); ULVAC, Inc., Chigasaki-shi (JP)

( * ) Notice: Subject to any disclaimer, the term of this patent is extended or adjusted under 35 U.S.C. 154(b) by 596 days.

(21) Appl. No.: 11/990,440

(22) PCT Filed: Aug. 15, 2006

(86) PCT No.: PCT/JP2006/316047
§ 371 (c)(1),
(2), (4) Date: Dec. 31, 2008

(87) PCT Pub. No.: WO2007/020926
PCT Pub. Date: Feb. 22, 2007

(65) Prior Publication Data
US 2009/0117747 A1 May 7, 2009

(30) Foreign Application Priority Data
Aug. 15, 2005 (JP) ................................. 2005-235400

(51) Int. Cl.
*H01L 21/302* (2006.01)
(52) U.S. Cl. ........................................ 438/716; 438/517
(58) Field of Classification Search .................... None
See application file for complete search history.

(56) References Cited

U.S. PATENT DOCUMENTS

| | | | |
|---|---|---|---|
| 6,107,215 A * | 8/2000 | Fujimura et al. | 438/798 |
| 6,597,964 B1 * | 7/2003 | Huang et al. | 700/121 |
| 2003/0060030 A1 * | 3/2003 | Lee et al. | 438/517 |
| 2003/0148621 A1 | 8/2003 | Takagi | |

FOREIGN PATENT DOCUMENTS

| | | |
|---|---|---|
| JP | 2003-124172 A | 4/2003 |
| KR | 2003-0026475 A | 4/2003 |
| WO | WO-01-73832 A1 | 10/2001 |

OTHER PUBLICATIONS

Hiroki Ogawa, et al, Dry Cleaning Technology for Removal of Silicon Native Oxide Employing Hot NH3/NF3 Exposure, Aug. 2002, Jpn. J. Appl. Phys., vol. 41, pp. 5349-5358.*

M. M Shaepkens, et al, Influence of reactor wall conditions on etch processes in inductively coupled fluorocarbon plasmas, 1998, J. Vac. Sci. Technol, A 16 (4), p. 2099-2107.*

* cited by examiner

*Primary Examiner* — Binh X Tran
*Assistant Examiner* — David Cathey, Jr.
(74) *Attorney, Agent, or Firm* — Birch, Stewart, Kolasch & Birch LLP

(57) ABSTRACT

Native oxide film on a semiconductor silicon wafer(s) is dry etched at a temperature of 50° C. or less. Hydrogen treatment is then carried out a temperature of 100° C. or more to bond the dangling bonds with hydrogen. A jig 9 that has been used is again used for loading new semiconductor silicon wafer(s) 10. The wafer(s) on the jig 9 is subjected to removal of a native oxide film and then hydrogen bonding. The resultant heat remains in jig and makes it difficult to maintain the wafers to temperature appropriate to removal of a native oxide film. After treatment of hydrogen bonding, inert gas having temperature of from 0 to −30° C. is injected into reaction vessel 5 and/or treatment preparing vessel 21, in which a native oxide film has been removed.

1 Claim, 16 Drawing Sheets

METHOD FOR SURFACE TREATING SEMICONDUCTOR

TECHNICAL FIELD

The present invention relates to a method for surface treatment of semiconductors, more particularly, relates to dry etching of semiconductors. Since the liquid in wet etching does not enter holes having high aspect ratios, dry etching is indispensable for removing a native oxide film in the production of semiconductor devices.

Dry etching is employed, for example, in production steps of semiconductor devices on a silicon wafer. In such steps, electrode material, such as polycrystalline silicon, doped polycrystalline silicon, metal, $TiSi_2$, $WSi_2$, TiN or the like is embedded in a contact hole. Dry etching is carried out to remove a native oxide film on the silicon exposed in a contact hole. Evidently, dry etching is effective as a pre-treatment for the general epitaxial growth. Dry etching is also effective as a pre-treatment of the selective epitaxial growth. An example of selective epitaxial growth is the formation of three or more layers for manufacturing a super high-speed SRAM. In such pretreatments, a native oxide film formed on the surface of a Si substrate is removed.

BACKGROUND TECHNIQUE

Patent Document 1, WO01/73832A1 proposed by the present applicants, discloses a batch-type dry etching method having superior productivity to the single wafer treatment. Its essence resides in that Si wafers are vertically arranged in a reaction vessel which is held at 50° C. or less and are rotated, while an etching reactive gas, such as $NF_3$, $NH_3$, $H_2$ or $N_2$ is horizontally fed thereto from a chamber having higher pressure than the reaction vessel, and then the Si wafers are heated to 100° C. or more for the hydrogen termination.

In the batch-type dry etching apparatus of Patent Document 1, lamp heaters radiate heat through a quartz window into the reaction vessel. Since the quartz reacts with the fluoride complex and results in formation of particles, the lamp heaters of an operating apparatus are located on the gas-exhausting side. In addition, the aluminum inner surface of the reaction vessel is subjected to luster treatment, so that the radiation heat is uniformly reflected from the inner lustrous surface of the reaction vessel over the reaction vessel interior. Temperature uniformity is thus enhanced.

When the batch treatment is performed repeatedly by the method of Patent Document 1, the following processes are carried out. That is, Si wafers are introduced in a reaction vessel. Since the interior of a reaction vessel is usually kept under vacuum, when the vessel is not operated, the reaction vessel is temporarily reverted to atmospheric pressure, prior to the introduction of Si wafers into the reaction vessel in the first batch. After introduction of the Si wafers, vacuum evacuation is carried out, and then purge gas such as nitrogen gas is introduced. In the second and subsequent batch treatments, when the wafer temperature is high, gasified liquid nitrogen or the like is used to cool the Si wafers. (2) $NF_3$ gas and $NH_3$, $H_2$ or $N_2$ gas are introduced in the reaction vessel to form a reaction product, i.e., a complex(es). This reaction complex etches a native oxide film having a thickness of a few to 20 angstroms of thickness. (3) Hydrogen termination is carried out by heating in a protective atmosphere containing hydrogen. This step is carried out to decompose a complex such as $(NH_4)_2SiF_6$, and cause the free arms (dangling bonds) of Si atoms to bond to hydrogen. (4) The Si wafers are moved outside the reaction vessel together with a supporting jig. (5) The Si wafers are dismounted from the supporting jig.

The reaction vessel used in the surface treating method of Patent Document 1 consists of aluminum-based material (page 7, lines 11 through 13), which had been subjected to anodic oxidation and then sealing treatment so as to provide the corrosion resistance against fluorine complexes. Since the reaction of fluorine complex stops at 60° C. or more, the temperature of a reaction vessel is desirably maintained higher than this temperature. However, when the temperature is high, since the radiation heat from the reaction vessel to a wafer disadvantageously increases, the temperature is maintained at an appropriate level. In addition, when the complexes are decomposed, the resulting Si, $SiO_2$, SiO, SiN, SiON and the like form particles that may adhere on the wall surface of the reaction vessel. The wall temperature of the reaction vessel is maintained at 30 to 60° C., so as not to advance reaction between the adhering matters and the wall surface in the subsequent step.

Patent Document 2: Japanese Unexamined Publication of Japanese Patent Application (kokai) No. 5-275392 proposes a single-wafer treatment, in which etching gases such as $NF_3$ and $H_2$ are caused to flow through a conduit provided with a microwave generator and then impinge upon a wafer by down stream method. In this Patent Document, cooling gas such as nitrogen gas is caused to flow through a susceptor, thereby maintaining the temperature of a wafer to −100° C. or lower. At this temperature, the etching proportion of Si relative to $SiO_2$ is adjusted such that the $SiO_2$ is etched off greatly more than Si.

Patent Document 1: WO01/73832A1
Patent Document 2: Unexamined Publication of Japanese Patent Application (kokai) 5-275392
Patent Document 3: Unexamined Publication of Japanese Patent Application (kokai) 7-121124
Non-patent Document 1: J. Appl. Phys. 74(2), 15, Jul., 1993, Damage-free selective etching of Si native oxides using $NH_3/NF_3$ and $SF_6/H_2O$ down flow etching page 1347, FIG. 6.

DISCLOSURE OF INVENTION

Problems to be Solved by Invention

In Patent Document 1, cooling takes place after removal of a native oxide film, decomposition of such a complex as $(NH_4)_2SiF_6$ and hydrogen termination. Such cooling is not specifically described in Patent Document 1 but might be non forcible cooling. Temperature change of a wafer in the case of non forcible cooling is described with reference to FIG. 17.

Etching removal of a native oxide film in the first batch is carried out at −20 to 50° C. Heat treatment is then carried out at 200° C. for the hydrogen termination. The wafers are then dismounted from a jig and are conveyed to a next process. The jig, which has been heated to approximately 100 to 200° C., is then non-forcibly allowed to cool (natural cooling). In this case, the stagnation time of the jig at 100 to 150° C. is so long that a considerably long time is necessary for further cooling down to room temperature. A next treatment is therefore carried out, while the jig, particularly supporting columns having heavy mass, is not sufficiently cooled. Therefore, in the next batch treatment, the wafer temperature remains high particularly at its contact portions with the jig. A peripheral portion of a wafer approximately 3 mm is discarded. A product is produced from an inside portion of a wafer. Removal of a native oxide film in the contact holes and the like at such inside portion affects the recovery of product.

In Patent Document 1, a wafer is cooled by gasified liquid nitrogen before a native oxide film is removed therefrom in a reaction vessel. A peripheral portion of a wafer is particularly excessively cooled resulting in poor etching reproducibility.

It is therefore an object of the present invention to provide a method of stably attaining high etching speed, when oxide film that forms on a semiconductor silicon wafer is dry etched repeatedly.

Means for Solving the Problem

The first and second methods of the present invention are related to a method, wherein: a semiconductor silicon wafer(s) is supported by a jig in such a manner that almost all of the surfaces of the semiconductor silicon wafer(s) is exposed in a reaction vessel, the inner surface of which consists of aluminum based material; a reaction product is formed by a first gas consisting of the microwave activated hydrogen or nitrogen or both and a second gas consisting of a compound free of carbon and oxygen and containing fluorine; a native oxide film present on the surface of the semiconductor silicon wafer(s) is removed at a temperature of 50° C. or less; bonding treatment is subsequently carried out at a temperature of 100° C. or more to bond hydrogen with the dangling bonds of Si exposed by the removal of the native oxide film; after the hydrogen bonding treatment the semiconductor silicon wafer(s) is carried out from the reaction vessel together with the jig; the semiconductor silicon wafer(s) is then dismounted from the jig; and, a new semiconductor silicon wafer(s) is mounted on the jig and is subjected to removal of a native oxide film and hydrogen bonding treatment in the reaction vessel.

The first method according to the present invention is characterized in that after completion of the hydrogen bonding treatment (namely, the hydrogen termination) inert gas with a temperature in the range of 0 to −30° C. is injected into the reaction vessel. In Patent Document 1, the reaction gas is injected through a chamber having higher pressure than the reaction vessel into the reaction vessel. This method may or may not be employed in the present invention.

The second method according to the present invention is characterized in that after completion of hydrogen bonding treatment the semiconductor silicon wafer(s) is carried out together with a jig into a treatment preparing vessel provided below, above or at the side of the reaction vessel, and inert gas at a temperature in a range of 0 to −30° C. is injected into the treatment preparing vessel.

A common feature of the first and second methods according to the present invention is that the semiconductor silicon wafer(s) (hereinafter referred to as "wafer") and a jig are cooled by inert gas at a temperature of from 0 to −30° C. subsequent to the hydrogen bonding treatment. Preferably, the inert gas is nitrogen, since it does not react with semiconductor and is inexpensive. Nitrogen at a temperature in the range of 0 to −30° C., particularly −10 to −20° C. is effective for cooling. When the temperature is lower than −30° C., the wafer temperature becomes non-uniform.

Preferably, heat exchange between nitrogen and a liquid at a temperature of from 0 to −30° C., such as brine or ethylene glycol, is carried out in dual tubes, fins and the like so as to adjust the temperature of nitrogen to the liquid temperature. An isothermal treating apparatus for producing such isothermal gas is published for example in Patent Document 3: Japanese Unexamined Publication (kokai) of Patent Application No. 7-121248. In addition, a commercially available thermo chiller may be used. A thermo chiller is sold by SMC Co. Ltd. and has heretofore been used to maintain the reaction tank of an etcher to a constant temperature of −20 to +40° C. within an accuracy of ±3° C. A thermo chiller that is already installed for cooling an etcher may be employed such that a portion of coolant gas is by-passed to an isothermal treatment apparatus used in the present invention. Alternatively, a tank of cooling liquid, such as brine or the like of an already installed chiller for an etcher is utilized. Heat exchange may be carried out in a surface treating apparatus of semiconductor.

The interior of a reaction vessel is 100° C. or more and usually has pressure in a range of 0.1 to 10 torr. The second method of the present invention is characterized in that the wafer and the like are cooled in a treatment preparing vessel separate from a reaction vessel. The wafer and the like can therefore be cooled in the treatment preparing vessel at a lower temperature than the reaction vessel. Effectiveness of cooling can therefore be further enhanced, so that the cooling to 20° C. or less, preferably 5 to 10° C. in terms of wafer temperature can be attained.

The treatment preparing vessel, in which the wafer is not yet loaded, may be under vacuum or normal pressure. When there is any pressure difference between these vessels, the pressure difference is preferably eliminated, and then the wafer is moved into the treatment preparing vessel.

According to the first method of the present invention, it is possible to cool enough to lower the wafer temperature to 20° C. or lower. After cooling, the temperature of wafer and jig was organoleptically measured by hand touching. The temperature of jig seems to be higher than that of the wafer at jig portions with complicatedly shapes by a few ° C. Consequently, the jig temperature is somewhat higher than 20° C. Temperature rise of new wafers can be suppressed. Reaction speed increases by approximately six times as the temperature fall of approximately 5° C. (see Non-Patent Document 3). Therefore, a seemingly small temperature decreases significantly increases the removal speed of a native oxide film. The etching rate increases according to the present invention as described above, and the throughput is stably enhanced.

In Patent Document 1, such gases as H, N and $NH_3$ are passed through a conduit, which is equipped with an applicator including a microwave generator of 2.45 GHz. Thus, gases are microwave activated. When such an applicator is used in the present invention, the output of the microwave can be lessened. The quartz of the applicator is therefore less damaged by microwaving, and hence particles of quartz are generated at small amounts. In addition, since the etching speed is enhanced, quartz of the tube may be replaced with sapphire or alumina, which forms particles with much more difficulty.

The present invention is hereinafter described in detail with reference to embodiments illustrated in the drawings.

BEST MODES FOR CARRYING OUT THE INVENTION

Figure 1:
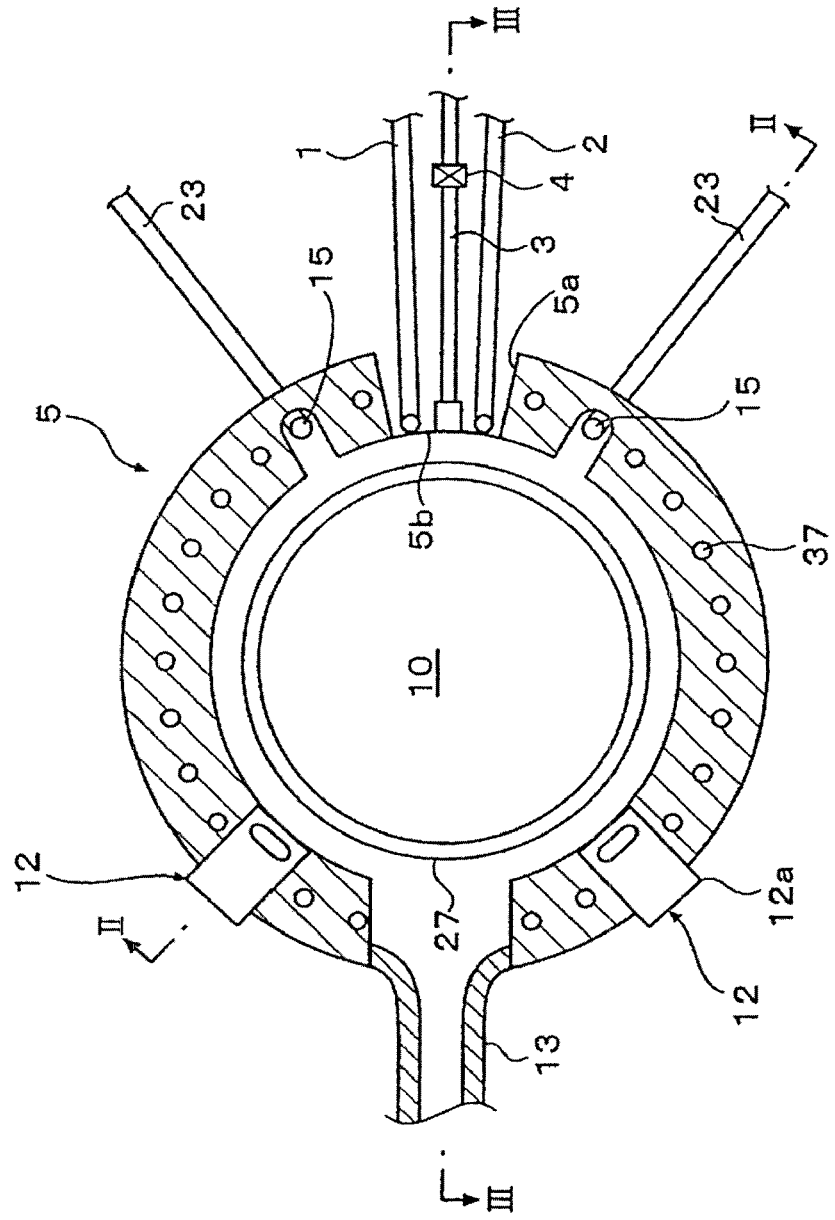
FIG. 1 is a partial view showing an example of a surface treating apparatus according to the first method of the present invention.
Figure 2:
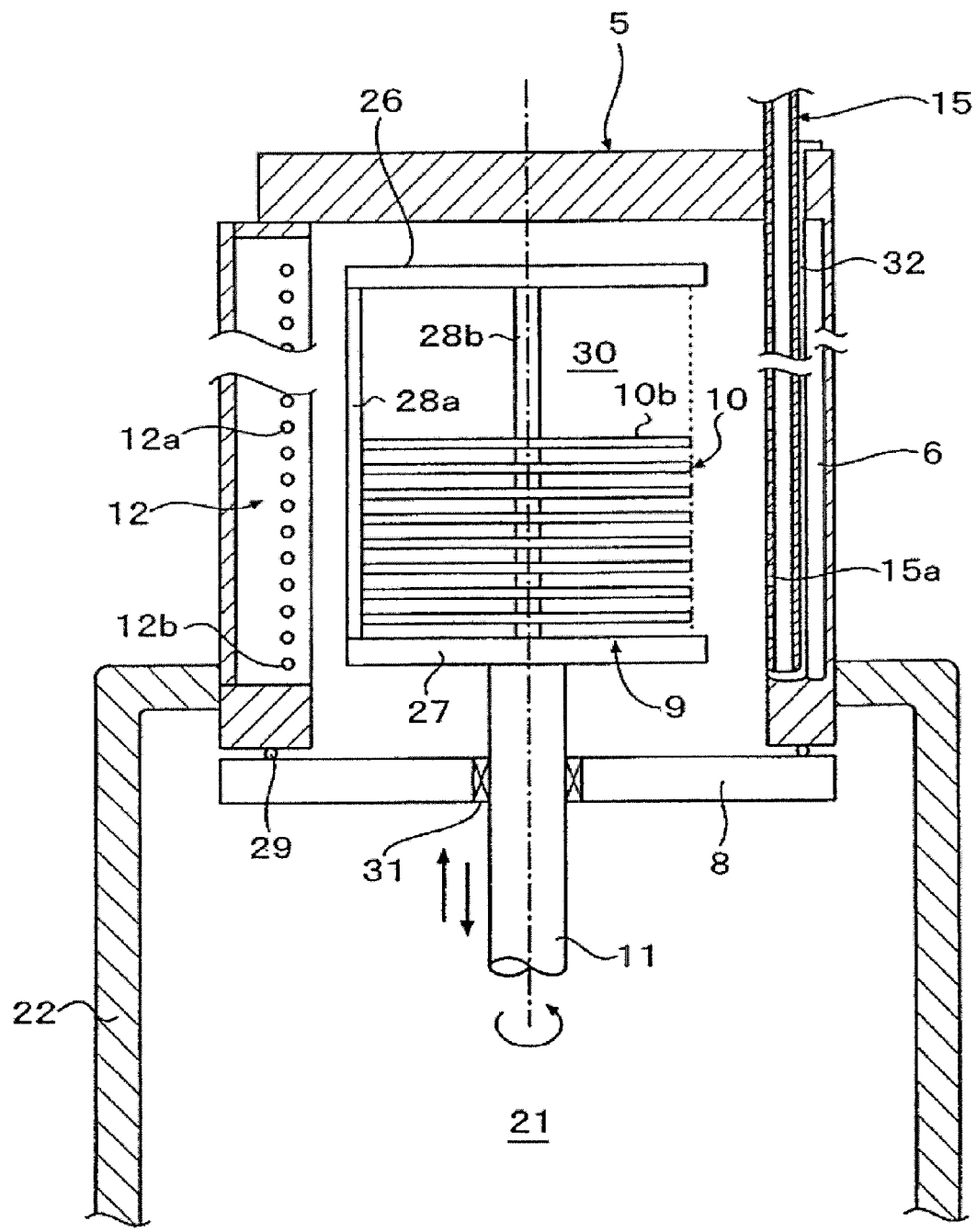
FIG. 2 is cross sectional view taken along line II-II of FIG. 1.
Figure 3:
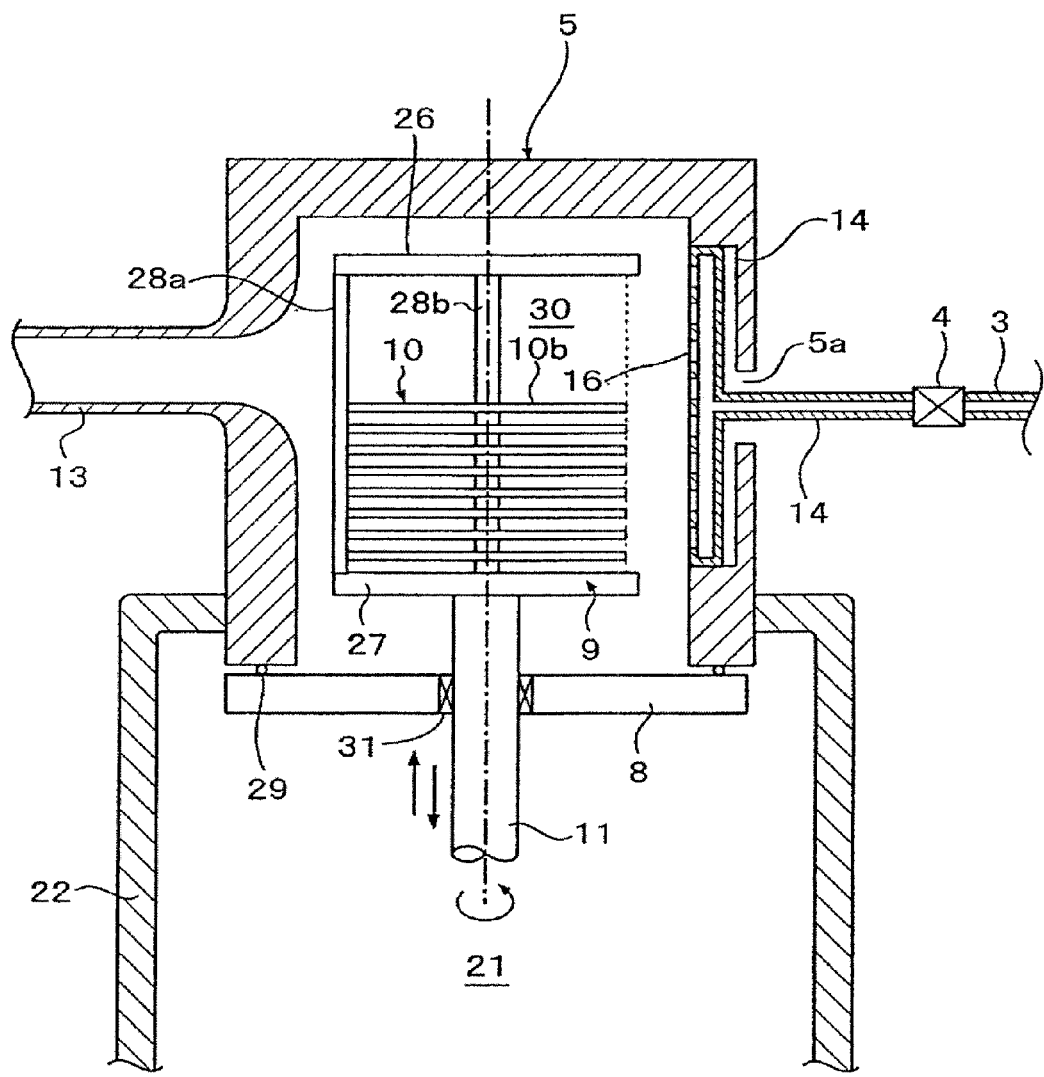
FIG. 3 is a cross sectional view taken along line III-III of FIG. 2.

The first method according to the present invention is described in detail hereinafter with reference to FIGS. 1 through 8. In those drawings, FIG. 1 is a horizontal cross sectional view of an apparatus for removing native oxide film. The first method of the present invention is carried out with an apparatus shown in FIG. 1 for a plurality of wafers. FIG. 2 is a cross sectional view taken along line II-II, while FIG. 3 is a cross sectional view taken along line III-III. Note that, the cooling-gas injecting nozzles 15 shown in FIG. 2 are not those of FIG. 1 but those of FIG. 16.

Construction of Apparatus

The first gas consists of molecules such as $H_2$, $N_2$ or compound such as $NH_3$. The conduit for flowing the first gas 3 is equipped with a microwave generator 4 of 2.45 GHz. Output of the microwave generator 4 is 3000 W for treating 8-inch wafers in a reaction vessel. Output is 6000 W for 12-inch wafers. In a case of 6000 W, two 3000 W microwave generators are connected in parallel. The conduits for flowing second gas such as $NF_3$ are denoted by 1, 2. The conduit for flowing first gas 3 and the conduits for flowing the second gas 1, 2 are opened at cutout 5a of a reaction tank 5, the inner surface of which is made of anodically oxidized aluminum. The front ends of the gas flowing conduits 1, 2, 3 are held by a partition plate 5b (see. FIG. 1). These gas flowing conduits are provided at their front ends a longitudinal box, which has at its front surface the gas injection apertures 16, 17, 18 (see FIG. 4), the number of which being approximately equal to the number of wafers. Therefore, almost all of the gases injected through these injection apertures 16, 17, 18 participate in the reaction within the reaction vessel 30. An extremely minor portion of the gases is brought into reaction on the front end of the gas steaming conduits and may deposit around the injection apertures. In order to avoid such deposition, the gas flowing conduits 1, 2, 3 may be cooled, although the structure becomes complicated.

An exhausting conduit 13 discharges the reacted gas and unreacted gas to the outside of the furnace and is located at a symmetrical position with respect to the gas flowing conduits 1, 2, 3. A not shown valve and a not shown pump are connected to the exhausting conduit 13 and vacuum is created through suction in the reaction vessel 30, in which wafers 10 are located.

A jig 9 (see FIGS. 2, 3, 5) locates the wafers 10 in the reaction vessel 30 with the vertically oriented wafer surface 10b. The jig 9 is secured on a rotary shaft 11 (FIG. 2) and can be vertically displaced in the reaction vessel 30. In FIG. 2, a bottom plate 8 and a reaction tank 5 are rigidly secured to one another via an O-ring 29. The rotary shaft 11 is rotated on a bearing 31 at approximately 5 to 10 rpm during treatments, such as cooling, etching removal of a native oxide film, and hydrogen bonding. In the jig 9, a top plate 26 and a bottom plate 27, both having slightly larger diameter than the wafers 10 are fixed by three vertical columns 8a, b, c (not shown in FIG. 1). Lugs 39 for gripping a wafer 10 (FIG. 5, 6) are attached to the vertical columns 8a, b, c. The reaction vessel 30 is closed at its bottom by a bottom plate 8 with the mounted bearing 31. When the rotary shaft 11 is rotated on the bearing 31, the wafers 10 are also rotated together with the jig 9. The vertical position of the reaction vessel 30 and the treatment preparing vessel 21 may be reversed. A reaction tank of treatment preparing vessel is denoted with 22. An O-ring is denoted with 29.

The reaction vessel 30 is defined within a reaction tank 5, in which hollow conduits 37 (FIG. 1) meander vertically. Isothermal gas flows in the hollow conduits and cools the reaction tank 5 to an appropriate temperature so that corrosion does not occur. The cooling gas of the reaction tank 5 is fed through a heat exchanger, which is the same as or different from the heat exchanger of the isothermal gas used for injecting through injecting nozzles 15.

Lamp heaters for heating and decomposing the complexes are denoted by 12. In the present embodiment, two lamps 12 are arranged at both sides of exhausting conduit 13, and a number of pairs of heaters 12a are arranged vertically.

Figure 5:
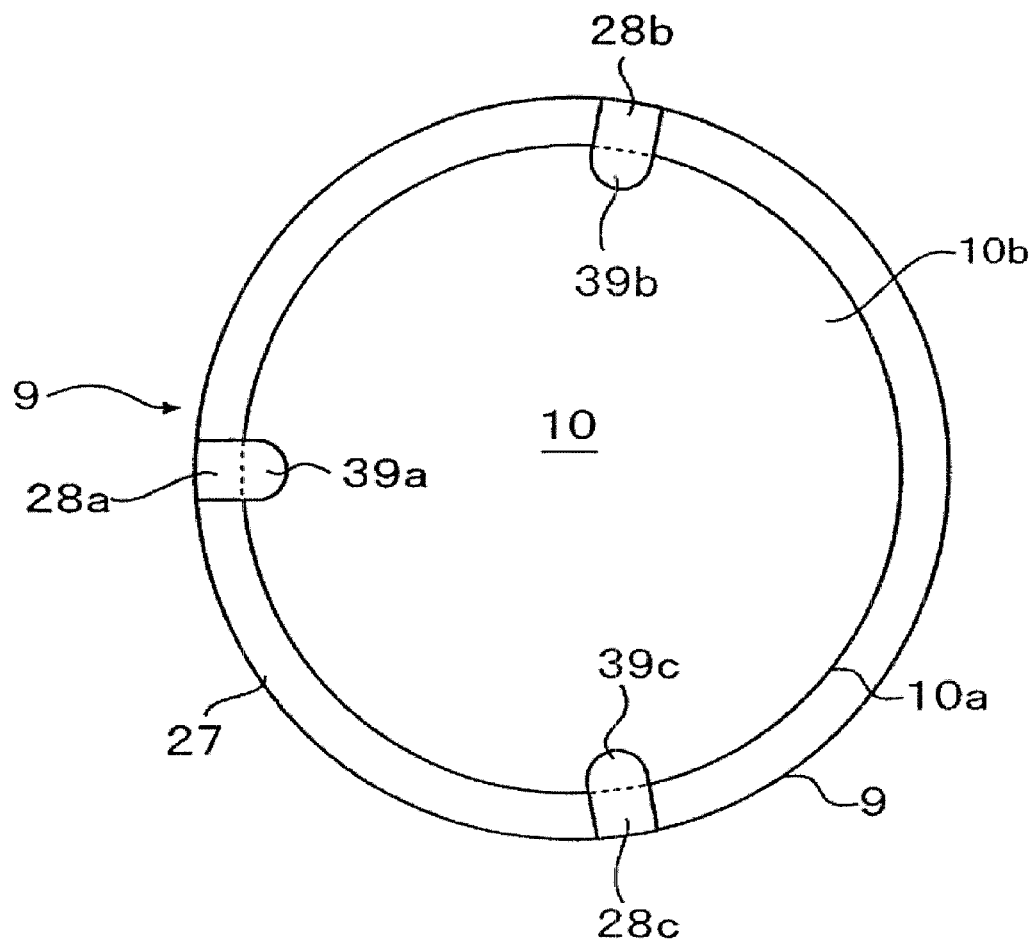
FIG. 5 is a plan view showing the supporting position of a wafer supporting jig.
Figure 6:
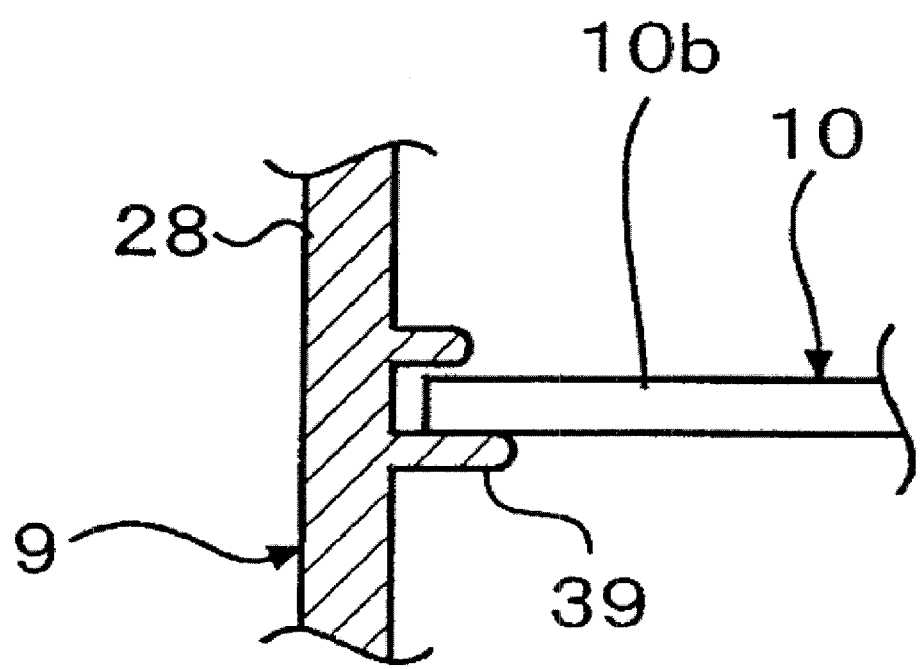
FIG. 6 is a partial enlarged view of the wafer supporting jig to show the lugs of jig.
Figure 7:
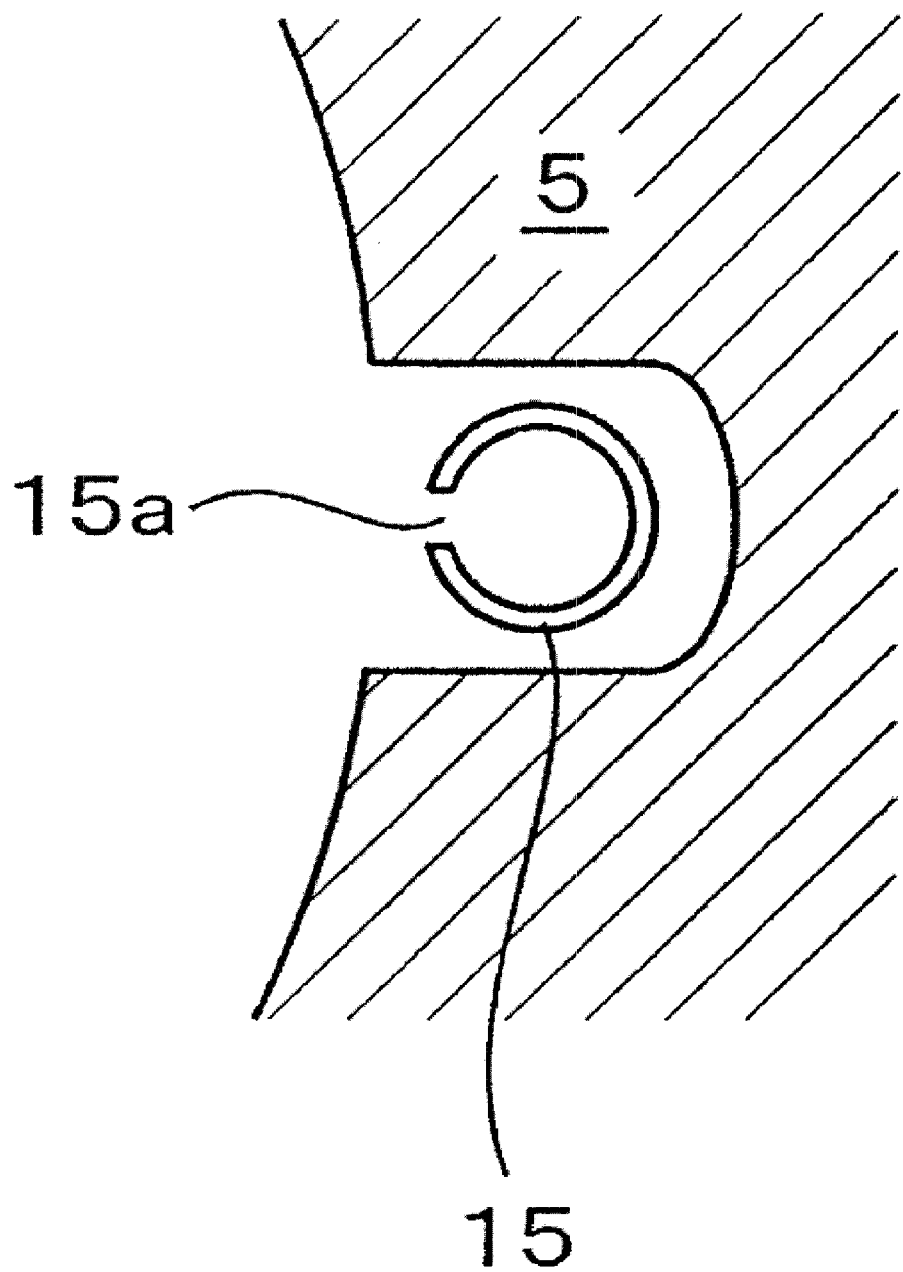
FIG. 7 shows the location of nozzles for injecting the cooling gas.
Figure 8:
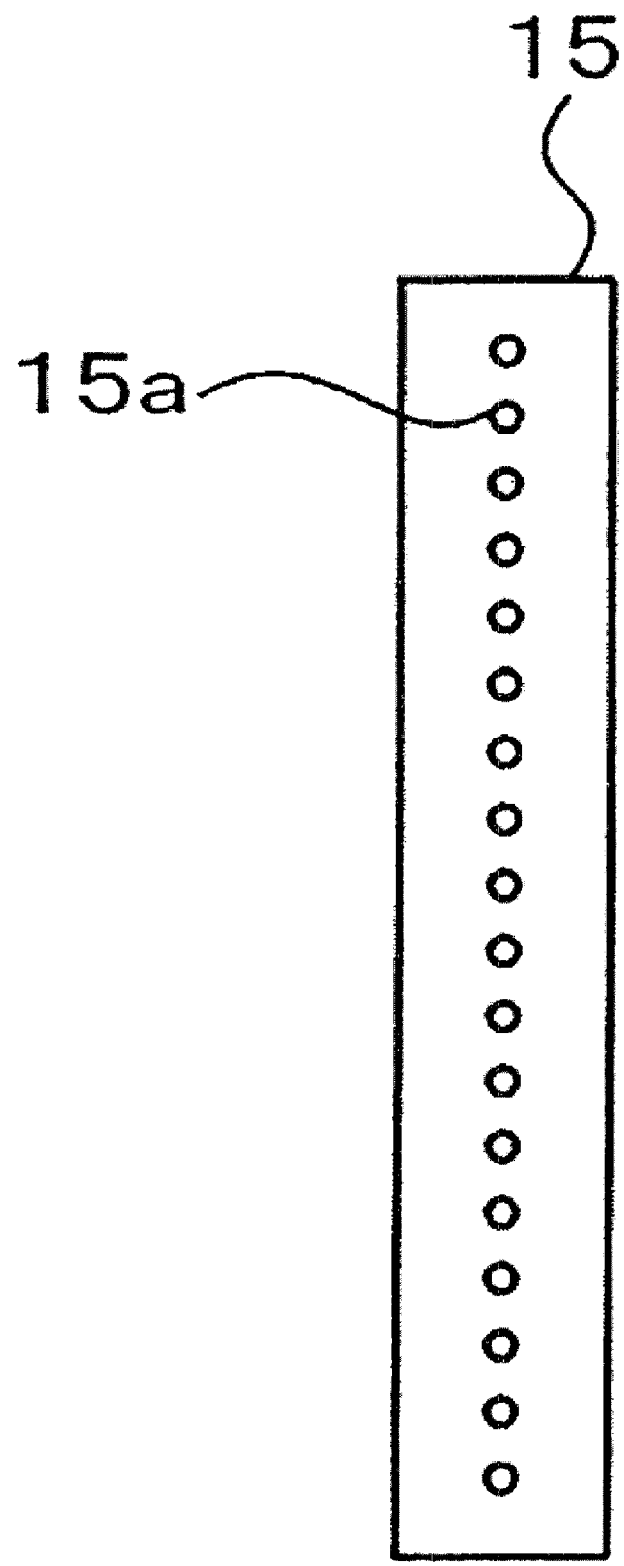
FIG. 8 is a front view of nozzles of cooling gas.

In FIGS. 5 and 6 is shown an example of a jig which supports a wafer 10 at its several peripheral locations. The upper and lower surfaces of wafer 10 is gripped by lugs 39 secured to and protruded from vertical columns 28. Patent Document 2 proposes a supporting method of a wafer over its entire surface by a suscepter. This method is not employed in the present invention but a wafer 10 is supported in such a manner that a surface area as large as possible, preferably 95% or more, is exposed. In addition, the word "exposed" means that the etching gas and cooling gas flow through an enough space between a wafer and an opposing wafer or another member, for example, a dummy wafer, a partition member. Usually, a gap space 2 mm or more is sufficient.

Pressure, Species, Etc of Gas

The microwave activated first gas is introduced through the gas flowing conduit 3 into the reaction vessel. The inner cross sectional area of the first gas flowing conduit 3 (directly after microwave generator 4, that is, besides a reaction vessel) may be from 0.2 to 0.8 times, preferably from 0.3 to 0.7 times the total cross sectional areas of the first gas-injection apertures 16. In this case, the reaction product or complexes are uniformly thick deposited on the wafer surface. As a result, the etching thickness of a plurality of wafers can be made very uniform. The pressure of the first and second gases in the gas flowing conduits is approximately 0.5 to 20 torr.

The first gas necessary for removing a native oxide film and the like is for example $N_2$, $H_2$, $NH_3$ and is microwave activated by a microwave generator 4 of 2.45 GHz. The first gas is then injected through gas injection apertures 16 into the reaction vessel 30. The flowing conduit of second gas 3 is made of quartz at a location of microwave generator 4, since quartz is stable against microwave. The other parts of flowing conduit of second gas 3 are made of aluminum.

Treatment Process (1)

Figure 4:
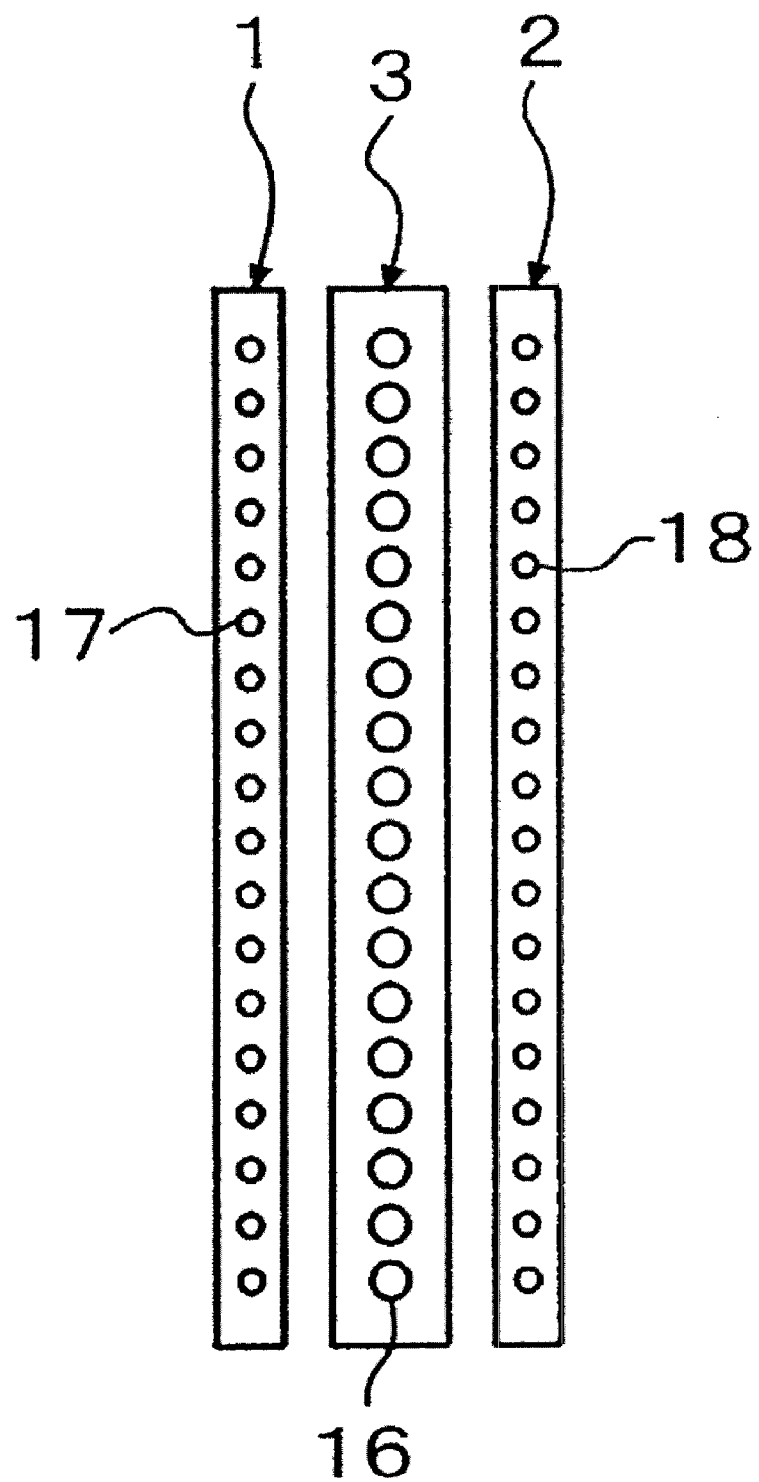
FIG. 4 is front view of the reaction gas introducing conduit seen from side of the reaction vessel.

The pressure within a reaction vessel is reduced to vacuum, followed by introducing a reaction gas consisting of the first and second gases. A native oxide film is thus removed. $NF_3$ gas is injected through injection apertures 17, 18 (FIG. 4). N, H or the like gas, which has been microwave activated, is injected through injection apertures 16, thereby etching native oxide film. The etching conditions are known from page 7, page 8, lines 1 through 20, and page 9, lines 3 through 10 of Patent Document 1.

According to the present embodiment, a native oxide film is removed while the wafers are located as shown in FIG. 2 and, then lamp heating is carried out at this location. When evacuation is carried out simultaneously with lamp heating, the complexes are decomposed and removed from the furnace through suction. Hydrogen gas, which is not microwave activated, is introduced through first gas steaming conduit 3 and is bonded with free Si arms (dangling bonds) which are exposed due to removal of a native oxide film.

Treating Process (2)

Nitrogen gas at a temperature of from 0 to −30° C. is fed through a conduit 23 (FIG. 1) having heat-insulating coating into the vicinity of reaction tank 5 and is then injected through injecting nozzles 15 (FIGS. 1, 2). The injected nitrogen gas flows over the wafer surface. Since vertical columns 28a, b, c (FIGS. 5, 6) are somewhat thick as described hereinabove, they are not satisfactorily cooled. As a result, the reaction speed lowers and the non-uniform reaction occurs in the subsequent treatment. These members of jig are therefore cooled together with the wafers 10.

The injecting nozzles 15 are mounted in a recess of cavity (FIG. 7) formed on the reaction tank 5 so as prevent interference between the nozzles 15 and rotating wafer 10 or jig 9. As seen in a front view of injecting nozzle 15, its front ends are arranged in a longitudinally elongated box. The number of injection apertures 15a (FIG. 8) is approximately the same as that of wafers.

Wafers 10 are heated to a considerably high temperature after heat treatments such as complex decomposition and formation of dangling bonds. Such wafers and the like can be cooled by injecting nitrogen cooling gas through the injection apertures 15a.

Subsequently, injecting of the nitrogen cooling gas is stopped. Nitrogen gas is then caused to flow through first gas flowing conduit 3 so as to again bring the pressure of a reaction vessel to normal pressure. The wafers 10 are lowered together with the jig 9 and the bottom plate 8 into the treatment preparing chamber 21, where the wafers 10 are allowed to cool. When temperature of wafers 10 is satisfactorily lowered, they are pulled off by a fork shaped jig. New wafers 10 are arranged on the jig 9, and the bottom plate 8 is lifted above until the position of bottom surface of the identical reaction vessel 30. Vacuum evacuation is the carried out.

Cooling-related data obtained using an apparatus shown in FIGS. 1 through 8 and liquid nitrogen of −20° C. are described. Wafers had a diameter of 12 inches. Fifty wafers were treated in one batch. Wafers of approximately 25° C. were cooled for 10 minutes. Temperature fall (° C.) attained by cooing is shown in Table 1.

TABLE 1

| Number | Pressure | Flow Rate | (Non)Evacuation | Temperature Fall (° C.) |
| --- | --- | --- | --- | --- |
| 1 | Atmospheric Pressure | 175 m³/min | None | 5 |
| 2 | Atmospheric Pressure | 125 m³/min | Evacuation | 6 |
| 3 | Atmospheric Pressure | 125 m³/min | Evacuation | 6 |
| 4 | $7.4 \times 10^3$ Pa | 50 m³/min | None | 0.5 |
| 5 | $2.3 \times 10^4$ Pa | 50 m³/min | None | 0.5 |
| 6 | $9.8 \times 10^3$ Pa | 100 m³/min | None | 5.5 |
| 7 | $6.5 \times 10^4$ Pa | 100 m³/min | None | 2.3 |
| 8 | $5.1 \times 10^4$ Pa | 85 m³/min | None | 2.5 |

In Nos. 4 through 8, the reaction vessel is not evacuated during cooling by nitrogen gas. In these cases, the reaction vessel was temporarily evacuated to vacuum, and then nitrogen gas was injected to attain the pressure mentioned in the Table 1. In No. 1, the evacuation to vacuum was temporarily carried out, and then nitrogen gas was injected until the atmospheric pressure has reached. Subsequent evacuation was not carried out. In Nos. 2 and 3, the evacuation to vacuum was temporarily carried out, and then nitrogen was injected until the atmospheric pressure has reached. Subsequent evacuation and nitrogen gas ejection were carried out while maintaining the atmospheric pressure. In any of these cases, temperature fall occurred. It is apparent from these data that temperature fall is significant, when pressure is as low as possible, the flow rate is as high as possible, and evacuation is carried out.

Subsequently, an embodiment of the second method according to the present invention is explained with reference to FIG. 9.

Figure 9:
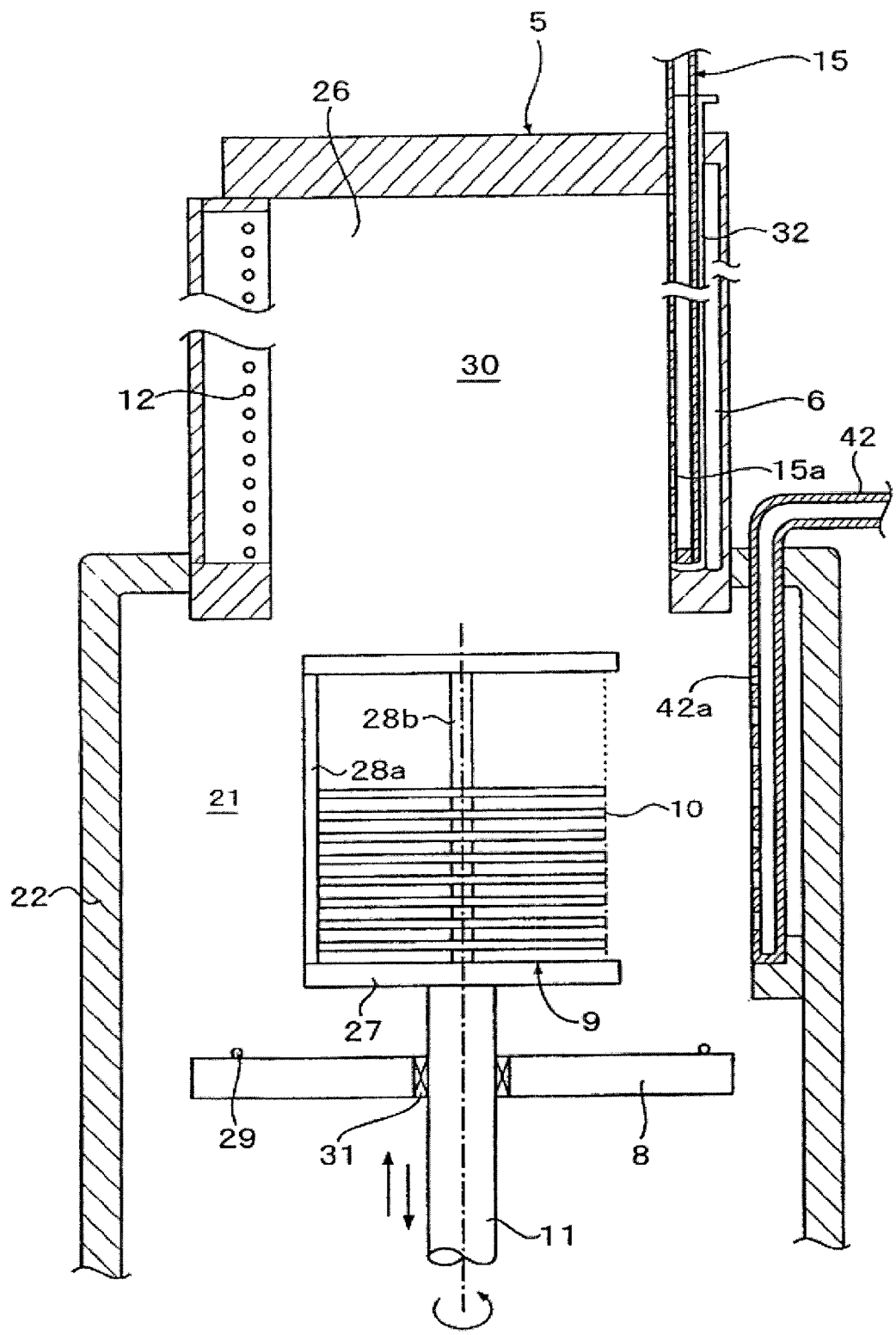
FIG. 9 is a partial cross sectional view showing an example of a surface treating apparatus to implement the second method of the present invention.

The structure of the apparatus shown in FIG. 9 is the same as the dry etching apparatus as described with reference to FIGS. 1 through 8. However, the apparatus shown in FIG. 9 is different from the one shown in FIGS. 1 through 8 in the point that a cooling gas conduit 42 protrudes into the reaction preparing vessel 21. Accordingly, etching and decomposition of complexes are carried out as described herein above, and wafers 10 at a temperature of 200 to 50° C. are lowered together with the jig 9 and the bottom plate 8 to treatment preparing vessel 21 as is shown in FIG. 9.

Wafers 10 are rotated together with the jig 9 and the bottom plate 8. During rotation, nitrogen cooling gas is injected through the cooling gas conduit 42 to thereby cool the wafers 10 to 5 to 20° C. When wafers 10 are small sized, that is, 5 inch or less, rotation is generally unnecessary. It is not at all detrimental that nitrogen gas intrudes into reaction vessel 30. However, when temperature of wafer is high, the nitrogen gas is warmed by wafers and then intrudes into reaction vessel. The temperature of removal reaction of a native oxide film may therefore be disadvantageously enhanced. A not shown openable shutter is preferably located between the reaction vessel 30 and the reaction preparing vessel 21 so as to intercept rise of nitrogen gas mentioned above.

A tank 22, which defines the reaction preparing vessel 21, may be provided with a not shown cooling means, such as circulating channel of cooling medium in the tank, so as to maintain temperature of the inner surface to 10 to 25° C.

Figure 10:
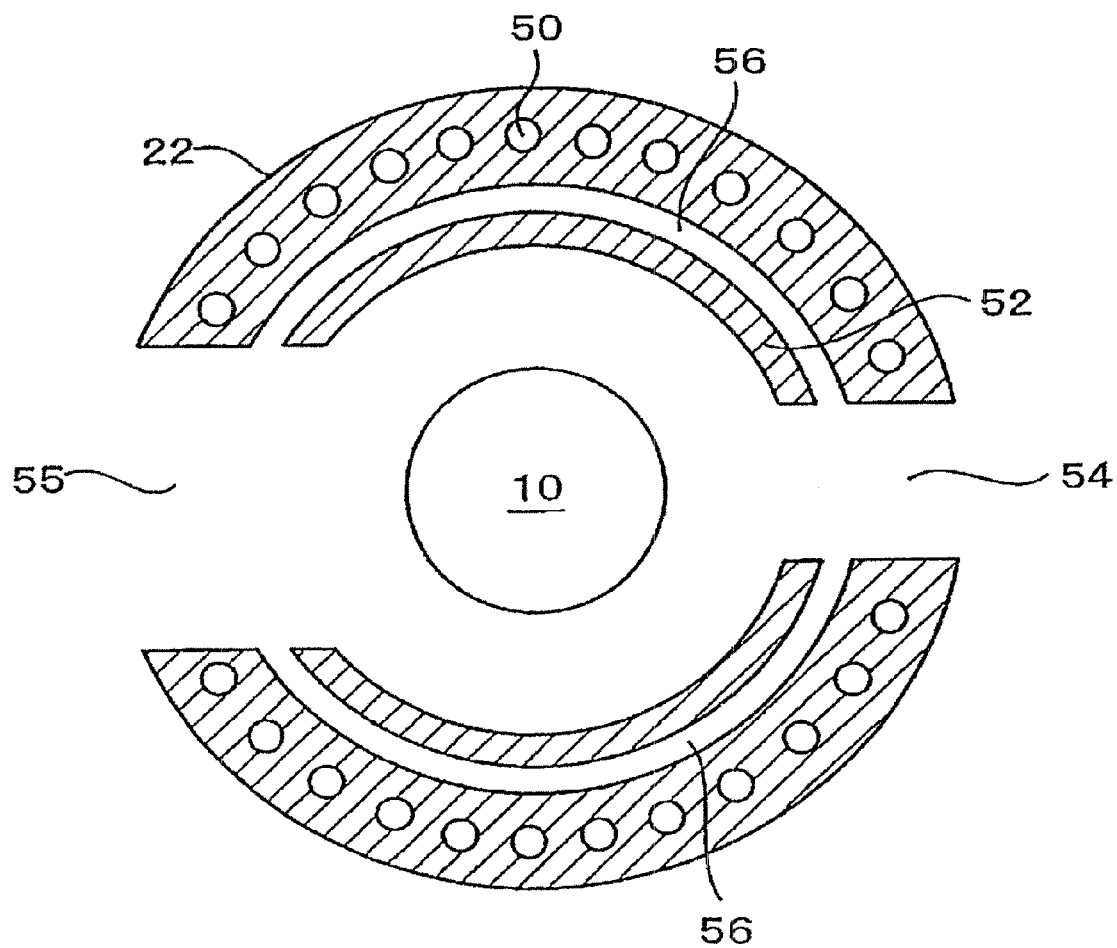
FIG. 10 illustrates a preferred embodiment of the second method and is a horizontal cross sectional view of a treatment preparing vessel.
Figure 11:
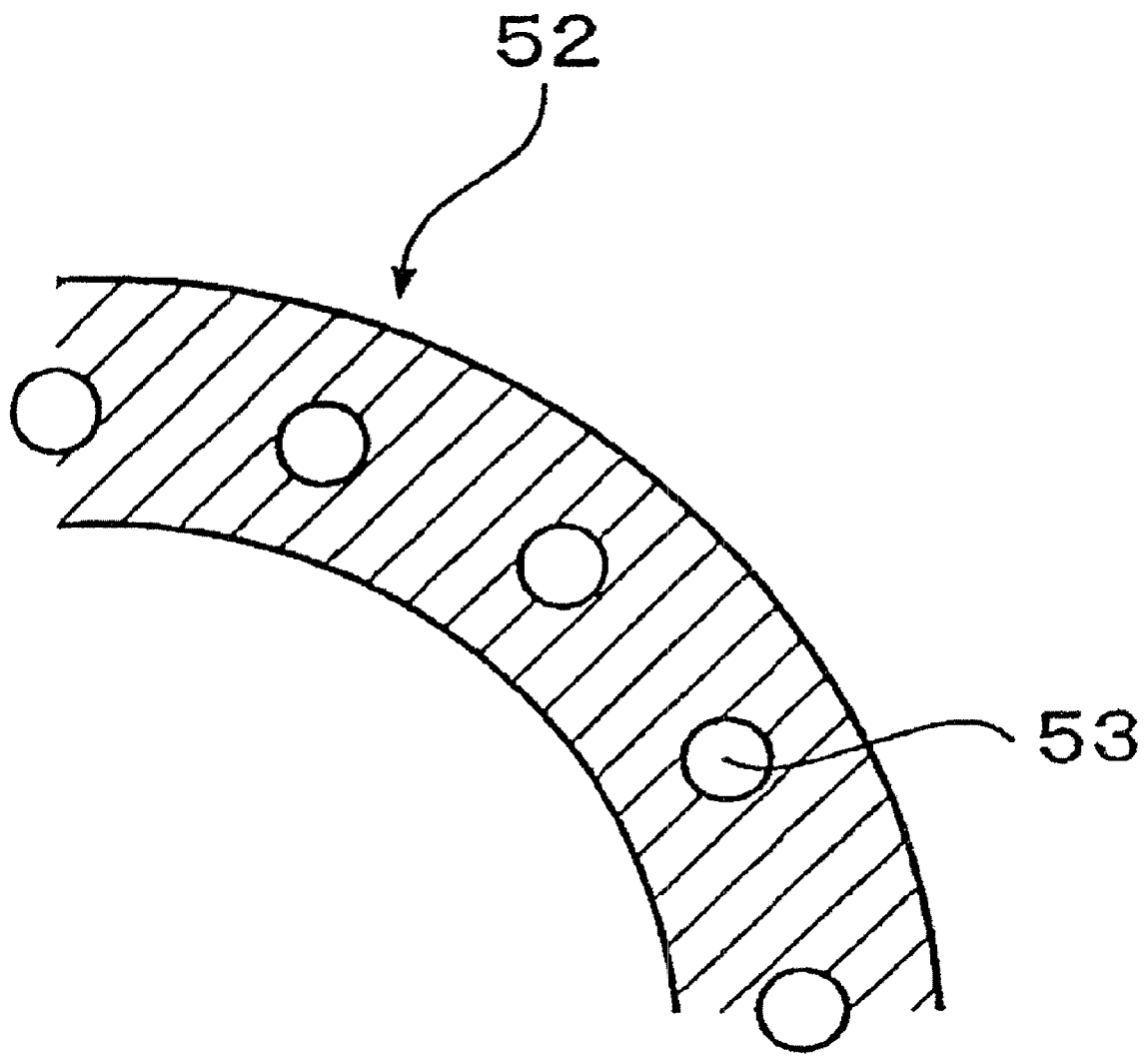
FIG. 11 is a partial enlarged view of the inner tubular body shown in FIG. 10.

Preferred embodiments of a reaction preparing vessel are illustrated in FIGS. 10 and 11. A reaction preparing vessel 21 comprises a tubular body 22 which is provided with a cutout 54 for evacuation. A cutout 55 is also formed to retractably inserting a mechanism for advancing and withdrawing wafers. In addition, a cooling medium channel 53 is formed in the tubular body 52 for flowing cooling media from a chiller. This cooling media cools the inner surface of a tubular body 52 to temperature lower than that of tank 21 of reaction preparing vessel. Preferably, cooling temperature is from 10 to 15° C. If further cooling is intended by a single tank 22, the temperature gradient across the tank is so increased that dropwise condensation occurs on the outer surface of tank. Thus temperature control becomes difficult. In order to avoid this inconvenience, a tubular body 52 is additionally provided inside the tank 22 according to the present invention. The additionally provided tubular body 52 is also cooled by using channel 53 of cooling media, in such a manner that the inner surface of tubular body 52 is cooled preferably to temperature of from 0 to 15° C. In stead of locating the cooling channel within the tubular body, a vertically meandering cooling conduit may be brought into tight contact with the outer surface of tubular body 52, thereby cooling it. The space between the tank 22 of cooling vessel 21 and tubular body 52 may be vacant. Alternatively, thermally insulating material may be sandwiched between them 22, 52.

Liquid nitrogen at a temperature of −20° C. was injected at a flow rate of 200 mm$^3$/min using an apparatus as shown in FIGS. 9 through 11, thereby cooling fifty 12-inch wafers. Temperature fall from approximately 18° C. to approximately 7° C. occurred in 60 minutes. Temperature fall under reduced pressure and temperature fall at atmospheric pressure were compared. The former was greater than the latter by approximately 2° C. Temperature of wafers at their different locations was such that a top wafer was higher in temperature than a bottom wafer by approximately 1° C.

Embodiments of a single wafer treatment are described with reference to FIGS. 12 through 14. In these drawings, the common members with FIGS. 1 through 3 are denoted by the same reference numerals. In the drawings, a supporting arm of a jig is denoted with 43. An L shaped front tip 44 is secured to the front end of supporting arm 43. A pin 45 upwardly extends from the L shaped front tip 44. The contacting portion of pin 45 with wafer is pointed as 45a. A wafer 10 is supported at a position as shown in FIG. 10. Injecting apparatuses of the first and second gases as well as cooling gas are illustrated collectively and schematically as 46. In addition, an ejector solely for cooling a jig (not shown) is also provided so as to cool the jig 9 as well.

Removal of a native oxide film on the wafer 10, heating for decomposing complex, hydrogen termination and cooling are successively carried out at a position shown in the drawings. The wafer 10 is subsequently lowered into the reaction preparing vessel 10, and the nitrogen gas cooling is carried out by a single gas injecting conduit 42. Nitrogen gas, which has been heat exchanged, is injected onto the wafer 10 and the like.

Figure 12:
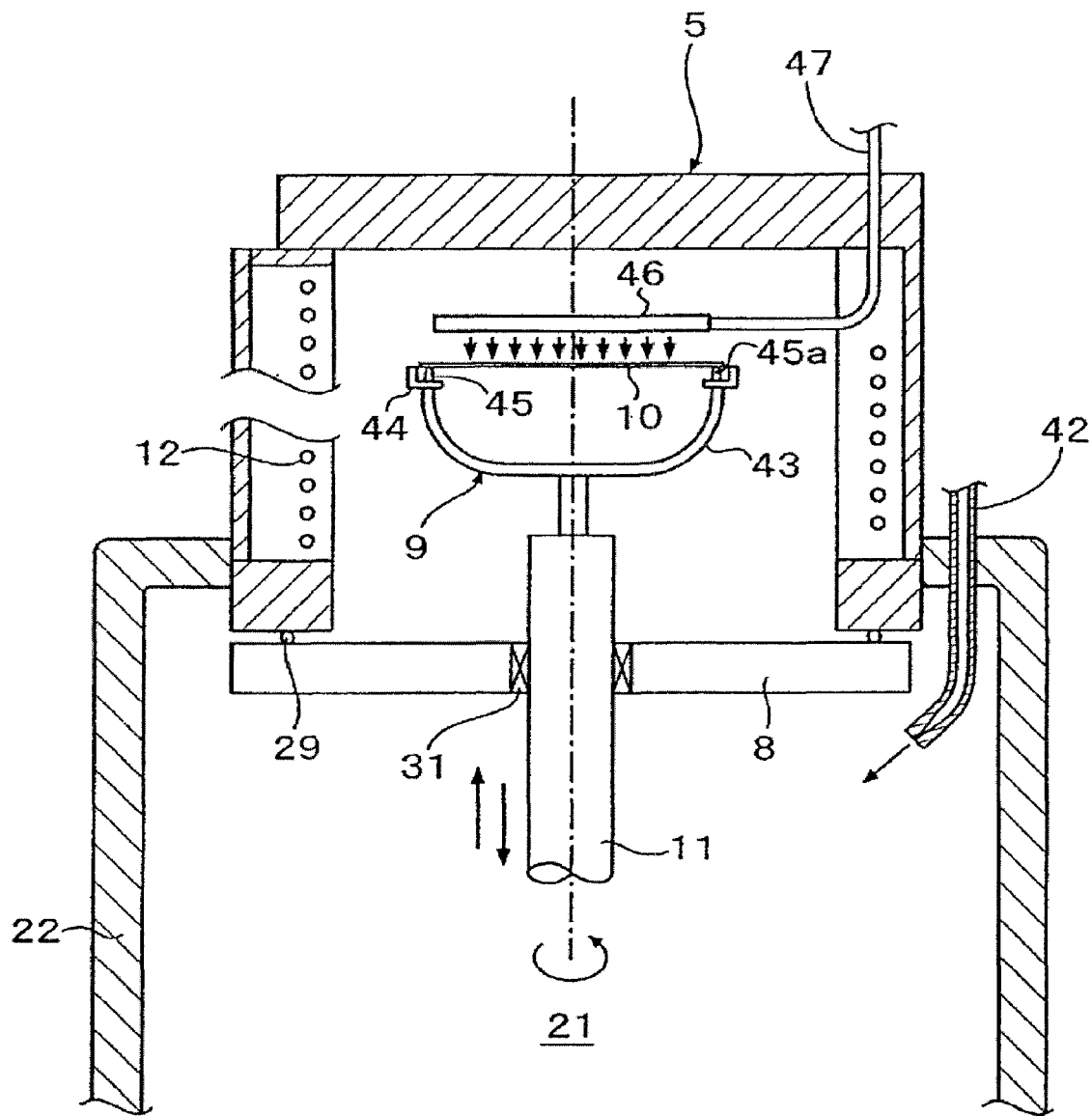
FIG. 12 is a plan cross sectional view showing an example of a surface treating apparatus according to the present invention, in which a single wafer treatment is carried out.
Figure 13:
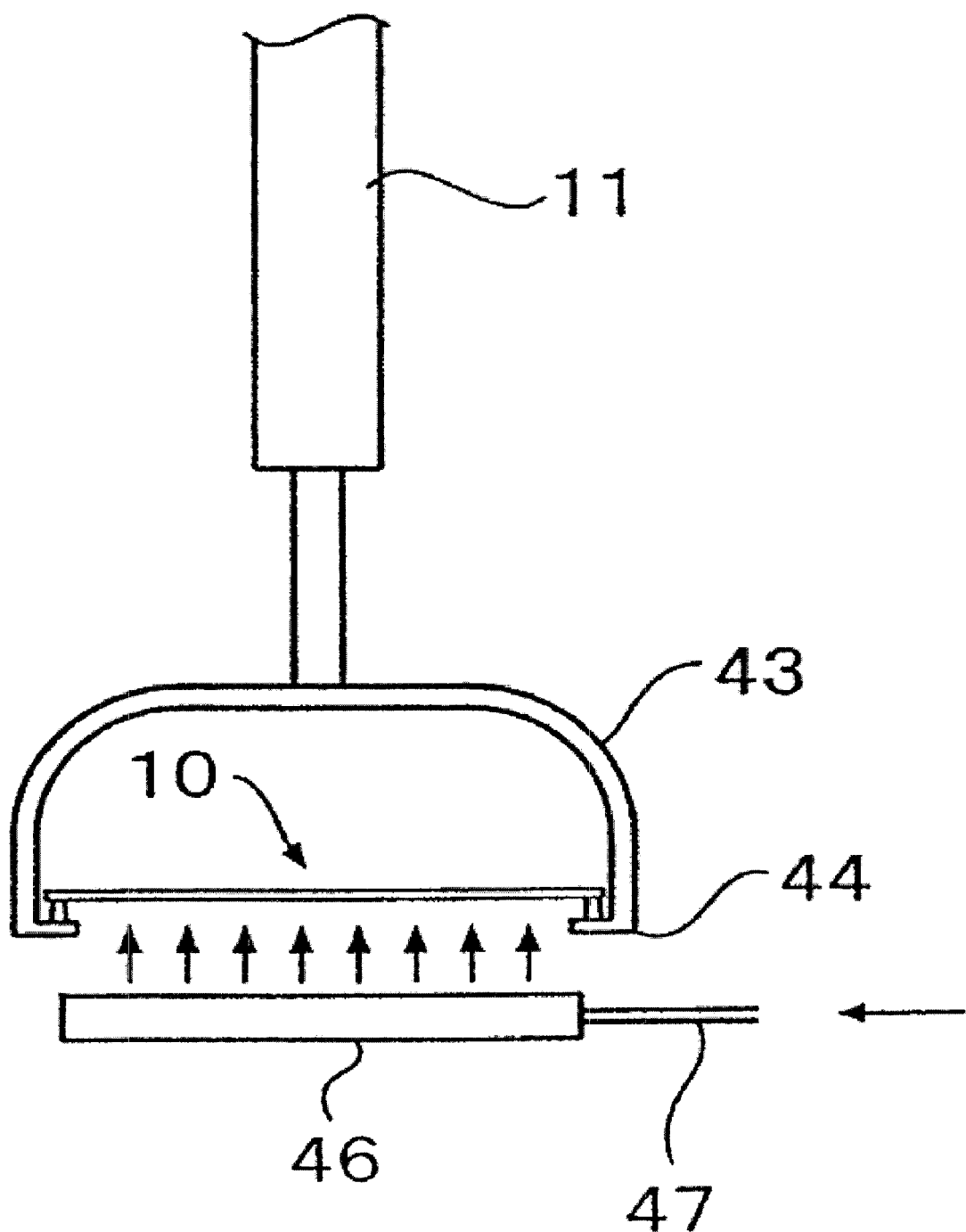
FIG. 13 shows a jig of suspension type.

A jig shown in FIG. 13 is different from that shown in FIG. 12 in the point that wafer 10 is suspended.

Figure 14:
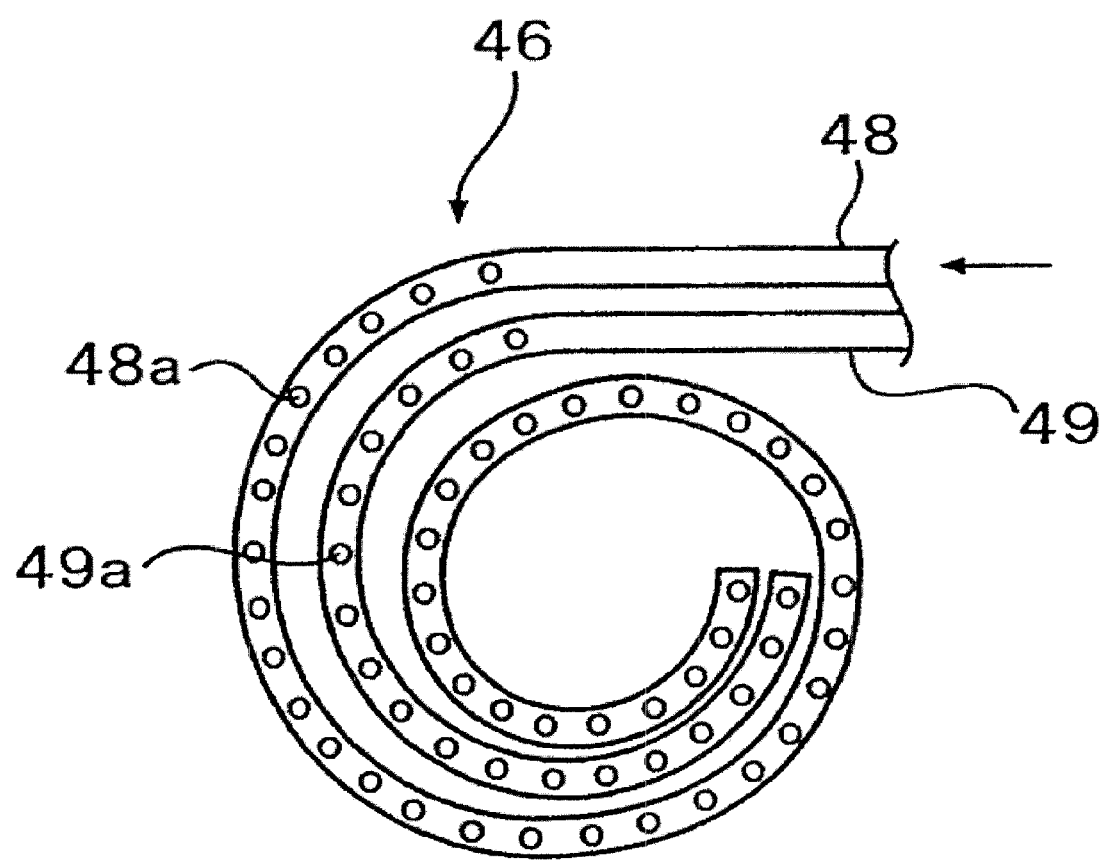
FIG. 14 is a front view or rear view of a gas injector used in FIGS. 12 or 13.

FIG. 14 is a plan view or bottom view of gas injector 46. Two conduits 48, 49 are arranged in spiral. The first gas is injected through injection apertures of either conduit, while the second gas is injected through injection apertures of the other conduit. Nitrogen (cooling) gas is injected through either or both of the conduits.

Figure 15:
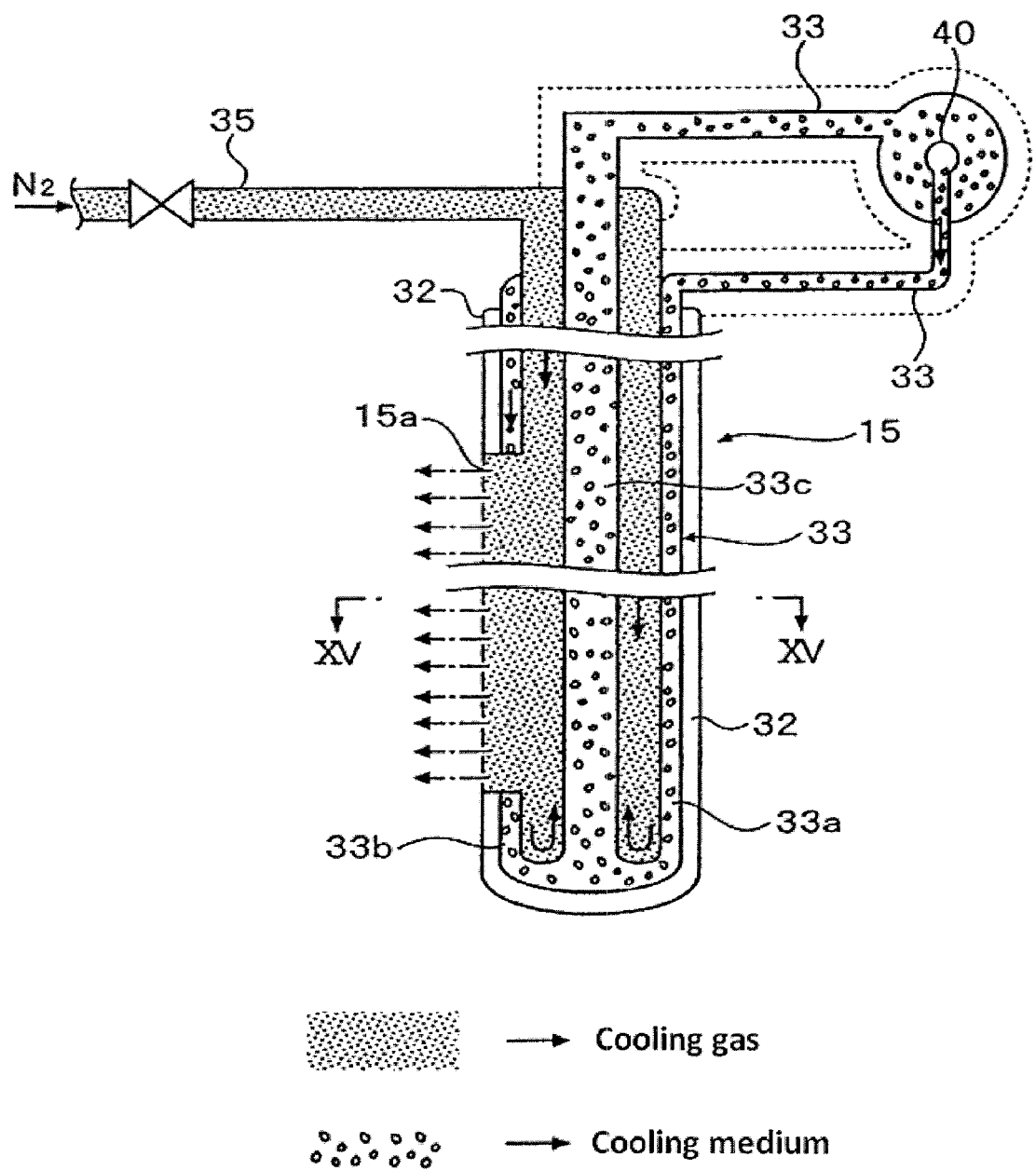
FIG. 15 shows a heat-exchanging type cooling-gas injecting apparatus provided with thermal insulating portion.
Figure 16:
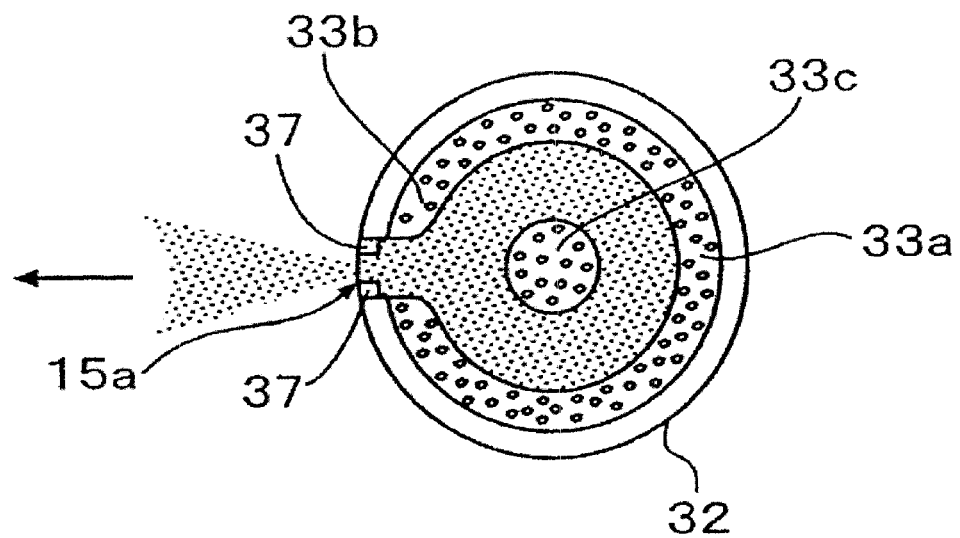
FIG. 16 is a cross sectional view along line X-X of FIG. 15.
Figure 17:
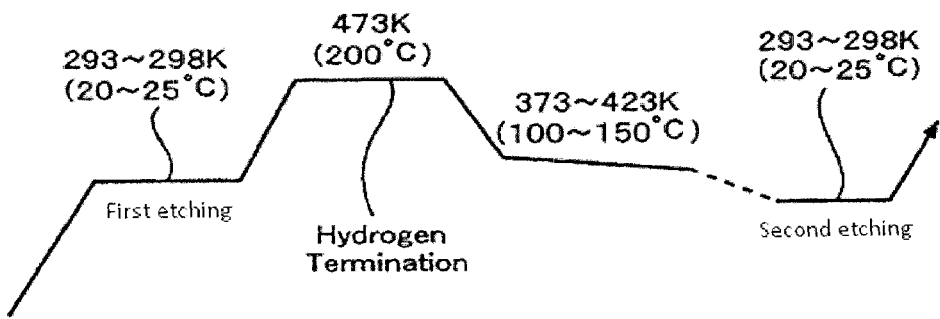
FIG. 17 is a graph showing the temperature change as experienced when the native oxide film is dry etched, complex is decomposed, and subsequently, the cooling is carried in a non-forcible manner.

Subsequently, in FIGS. 15 and 16 are shown an embodiment, in which a cooling gas flowing conduit 23 is thermally insulated, and a chiller is used. These embodiments are illustrated.

In FIG. 15, a chiller is shown. The chiller is an isothermal treating apparatus comprising a heat exchanger 32. The heat exchanger 32 is disposed as a whole in the reaction vessel 30 but at the most outside portion thereof (FIG. 2). The heat exchanger 32 is located outside of a cooling gas flowing conduit 35, so that heat exchange between brine or the like and cooling gas is realized. It has a thermal insulating portion consisting of filled thermal insulating material or has a vacuum structure. The vacuum structure is preferable at −40° C. or less and thermal insulating material is preferable at a higher temperature. Thermal insulating portion 32 shields the nitrogen gas (shown by dots) from heat radiated from the jig 9 subsequent to heat treatment for decomposing complex. Since a cooling conduit 15 shown in FIG. 15 has a large diameter, it is difficult to accommodate it 15 in a concavity shown in FIG. 7 and may hence be appropriately located in the reaction vessel 30. A heat exchanger may be embodied as such a triple tube structure so that injection apertures 15a are not formed. Nitrogen gas is fed into a reaction vessel through a gas flowing conduit. Such a heat exchanger may be provided outside and in the vicinity of a reaction vessel, for example approximately 100 mm distant from the reaction vessel.

Nitrogen gas is fed through a cooling gas flowing conduit 35. Its indirect cooling part where the liquid cooling medium is brought into indirect contact with the nitrogen gas is embodied as an annular shape. Indirect contact occurs at the inside and outside of the annular conduit. An introducing conduit of liquid cooling media 33 leaves brine tank 40 (schematically shown) and is divided into two annular channels (33a, 33b). These channels 33a, 33b then join in one central channel (33c) and this is again returned to brine tank 40.

INDUSTRIAL APPLICABILITY

As is described hereinabove, a native oxide film can be stably removed at high speed according to the present invention. In addition, the dry etching process can be shortened and the particles can be lessened.

The invention claimed is:

1. A method for surface treatment of semiconductor, wherein:
at least one semiconductor silicon wafer is supported by a jig in such a manner that almost all of the surfaces of the at least one semiconductor silicon wafer is exposed in a reaction vessel, the inner surface of which consists of aluminum based material; a reaction product is formed by a first gas consisting of a microwave activated hydrogen or nitrogen or both and a second gas consisting of a compound free of carbon and oxygen and containing fluorine; a native oxide film present on the surface of the at least one semiconductor silicon wafer is removed at a temperature of 50° C. or less; bonding treatment is subsequently carried out at a temperature of 100° C. or more to bond hydrogen with the dangling bonds of Si exposed by the removal of the native oxide film; after the hydrogen bonding treatment the at least one semiconductor silicon wafer is carried out from the reaction vessel together with the jig; the at least one semiconductor silicon wafer is then dismounted from the jig; and, at least one new semiconductor silicon wafer is mounted on the jig and is subjected to removal of a native oxide film and hydrogen bonding treatment in the reaction vessel;
characterized in that, subsequent to completion of the hydrogen bonding treatment, inert gas having temperature in a range of 0 to −30° C. is injected into the reaction vessel, thereby cooling said at least one semiconductor silicon wafer to a temperature of 20° C. or lower; and then, the at least one semiconductor silicon wafer is carried out together with a jig into a treatment preparing vessel provided below, above or side of the reaction vessel, and inert gas at a temperature in a range of 0 to −30° C. is injected into the treatment preparing vessel.

* * * * *